United States Patent
Lindberg

(10) Patent No.: US 8,994,040 B2
(45) Date of Patent: Mar. 31, 2015

(54) METHOD OF PRODUCING AN OPTOELECTRONIC COMPONENT AND COMPONENT

(75) Inventor: Gudrun Lindberg, Bad Abbach (DE)

(73) Assignee: OSRAM Opto Semiconductors GmbH (DE)

(*) Notice: Subject to any disclaimer, the term of this patent is extended or adjusted under 35 U.S.C. 154(b) by 46 days.

(21) Appl. No.: 13/992,046

(22) PCT Filed: Dec. 5, 2011

(86) PCT No.: PCT/EP2011/071725
§ 371 (c)(1),
(2), (4) Date: Jul. 22, 2013

(87) PCT Pub. No.: WO2012/076458
PCT Pub. Date: Jun. 14, 2012

(65) Prior Publication Data
US 2013/0292715 A1 Nov. 7, 2013

(30) Foreign Application Priority Data
Dec. 10, 2010 (DE) .......... 10 2010 054 068

(51) Int. Cl.
*H01L 29/18* (2006.01)
*H01L 33/00* (2010.01)
(Continued)

(52) U.S. Cl.
CPC .......... *H01L 33/36* (2013.01); *H01L 33/0079* (2013.01); *H01L 2924/0002* (2013.01)
USPC .......... 257/88; 257/98; 257/99; 257/100; 438/22; 438/28

(58) Field of Classification Search
USPC .......... 257/88, 98–100; 438/22, 26, 27, 28, 34
See application file for complete search history.

(56) References Cited

U.S. PATENT DOCUMENTS 6,111,272 A    8/2000  Heinen
6,967,115 B1 * 11/2005  Sheats .......................... 438/22
7,183,661 B2 *  2/2007  Bogner et al. ................ 257/793
(Continued)

FOREIGN PATENT DOCUMENTS

DE    10 2005 055 293 A1    2/2007
DE    10 2007 004 304 A1    7/2008
(Continued)

OTHER PUBLICATIONS

Schnitzer et al., "*30% external quantum efficiency from surface textured, thin-film light-emitting diodes*," Appl. Phys. Lett. 63 (16), Oct. 18, 1993, pp. 2174-2176.
(Continued)

*Primary Examiner* — Mary Wilczewski
*Assistant Examiner* — Erik T Peterson
(74) *Attorney, Agent, or Firm* — DLA Piper LLP (US)

(57) ABSTRACT

A method of producing an optoelectronic component including providing an epitaxially grown layer sequence on a growth substrate, which comprises a suitable layer for light emission; applying a metal layer to the epitaxially grown layer sequence; applying a molding support to the metal layer, the molding support including a support material with a first coefficient of thermal expansion and a fiber mesh with a second coefficient of thermal expansion functionally bonded to the support material; and detaching the growth substrate.

7 Claims, 6 Drawing Sheets

(51) Int. Cl.
*H01L 33/36* (2010.01)
*H01L 21/00* (2006.01)

(56) References Cited

U.S. PATENT DOCUMENTS

| | | | |
|---|---|---|---|
| 7,208,769 B2* | 4/2007 | Guenther et al. | 257/88 |
| 2002/0167804 A1* | 11/2002 | Towle | 361/765 |
| 2007/0262336 A1 | 11/2007 | Tamaki et al. | |
| 2009/0199401 A1* | 8/2009 | Kerr et al. | 29/848 |
| 2009/0200550 A1* | 8/2009 | Kerr et al. | 257/49 |
| 2010/0059782 A1* | 3/2010 | Fujitomo et al. | 257/98 |
| 2010/0072500 A1 | 3/2010 | Herrmann | |
| 2010/0084167 A1* | 4/2010 | Shim et al. | 174/252 |
| 2010/0133564 A1 | 6/2010 | Herrmann et al. | |
| 2010/0157568 A1* | 6/2010 | Ewe et al. | 361/820 |
| 2010/0213499 A1* | 8/2010 | Yamamoto | 257/99 |
| 2011/0108870 A1 | 5/2011 | Jaeger et al. | |
| 2011/0274888 A1* | 11/2011 | Tang et al. | 428/189 |

FOREIGN PATENT DOCUMENTS

| | | |
|---|---|---|
| DE | 10 2008 025 491 A1 | 12/2009 |
| EP | 0 905 797 A2 | 3/1999 |
| KR | 10-2007-0001512 | 1/2007 |
| KR | 10-2008-0035679 | 4/2008 |
| WO | 02/13281 A2 | 2/2002 |

OTHER PUBLICATIONS

English translation of Korean Examination Report dated May 30, 2014 from corresponding Korean Patent Application No. 10-2013-7015922.

* cited by examiner

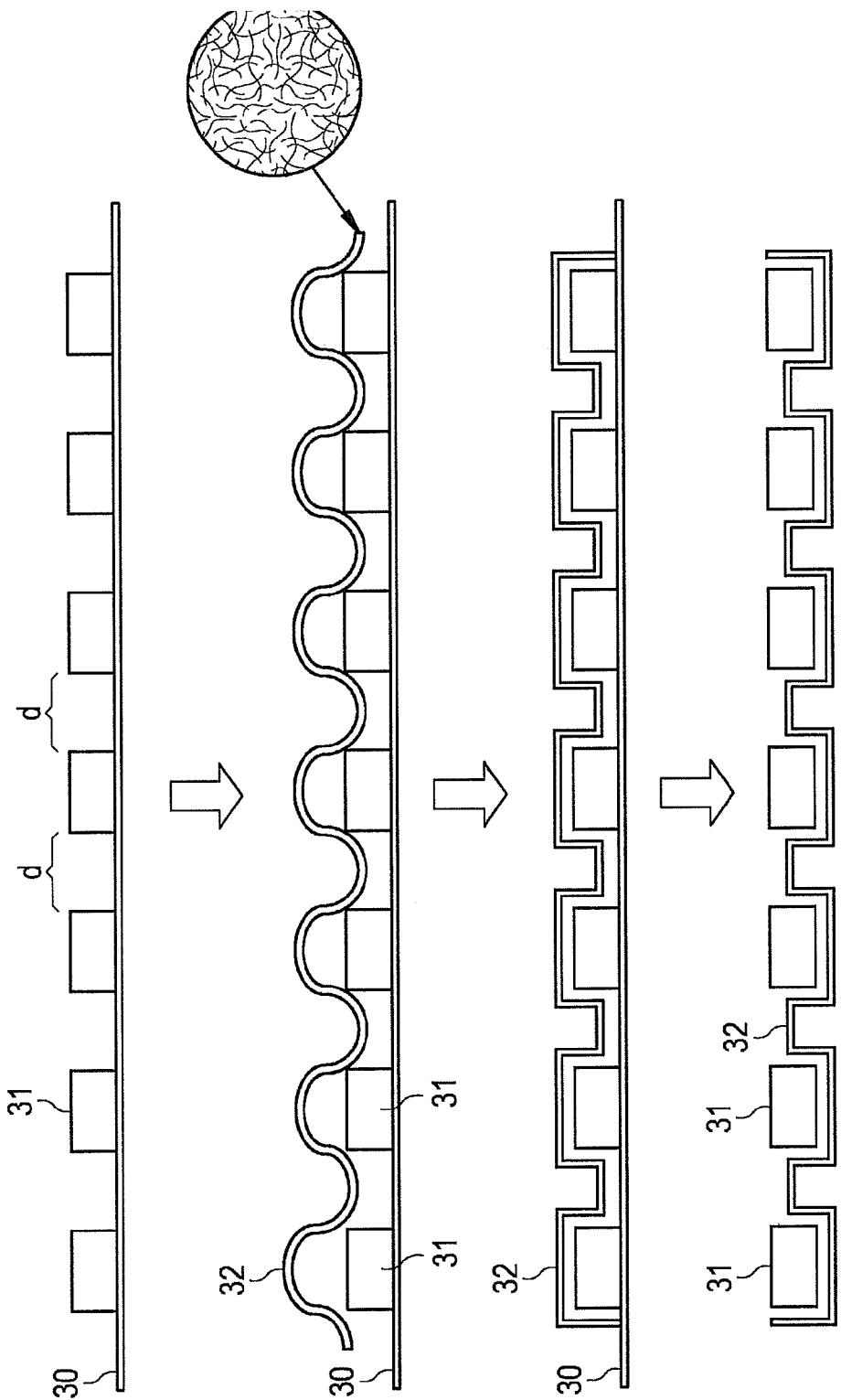

METHOD OF PRODUCING AN OPTOELECTRONIC COMPONENT AND COMPONENT

TECHNICAL FIELD

This disclosure relates to a method of producing an optoelectronic component and to a component.

BACKGROUND

Optoelectronic components are often produced by epitaxial deposition methods on a growth substrate. After deposition of a light-emitting layer sequence, the components have to be contacted on both sides in further method steps and then singulated. In an essential process step, the component is therefore applied to a support so that the growth substrate can then be detached and the exposed layer sequence processed further.

Further processing includes further etching and cleaning steps to arrange contact zones for the subsequent optoelectronic components on the wafer structure. Individual steps of the further production method may therefore also require relatively high temperatures.

Elevated temperatures or a rapid temperature change may result in thermal strain due to the different coefficients of thermal expansion of the support substrate and the epitaxial layer sequence arranged thereon. The resultant significant mechanical stress may lead to warpage of the entire wafer. Non-uniform processing and possible wafer breakage are the consequence, resulting in reduced yield.

There is thus a need for a method in which such thermal strain is reduced.

SUMMARY

I provide method of producing an optoelectronic component including providing an epitaxially grown layer sequence on a growth substrate, which comprises a suitable layer for light emission; applying a metal layer to the epitaxially grown layer sequence; applying a molding support to the metal layer, the molding support including a support material with a first coefficient of thermal expansion and a fiber mesh with a second coefficient of thermal expansion functionally bonded to the support material; and detaching the growth substrate.

I also provide an arrangement of a plurality of optoelectronic components spaced apart from one another on a tape, the optoelectronic components including an epitaxially grown layer sequence suitable for light emission in a main direction; a metal layer on a side of the epitaxially grown layer sequence remote from the main direction; and a molding support with a support material with a first coefficient of thermal expansion and with a fiber mesh with a second coefficient of thermal expansion functionally bonded to the support material; wherein part of the fiber mesh and of the support material is arranged in interspaces between two adjacent components.

I further provide a method of producing an optoelectronic component, including providing an epitaxially grown layer sequence on a growth substrate, which comprises a suitable layer for light emission; applying a metal layer to the epitaxially grown layer sequence; applying a molding support to the metal layer, the molding support comprising a support material with a first coefficient of thermal expansion and a fiber mesh with a second coefficient of thermal expansion functionally bonded to the support material; detaching the growth substrate; and removing the molding support after detachment of the growth substrate.

BRIEF DESCRIPTION OF THE DRAWINGS

FIG. 7 shows an example of our method.

DETAILED DESCRIPTION

Figure 1:
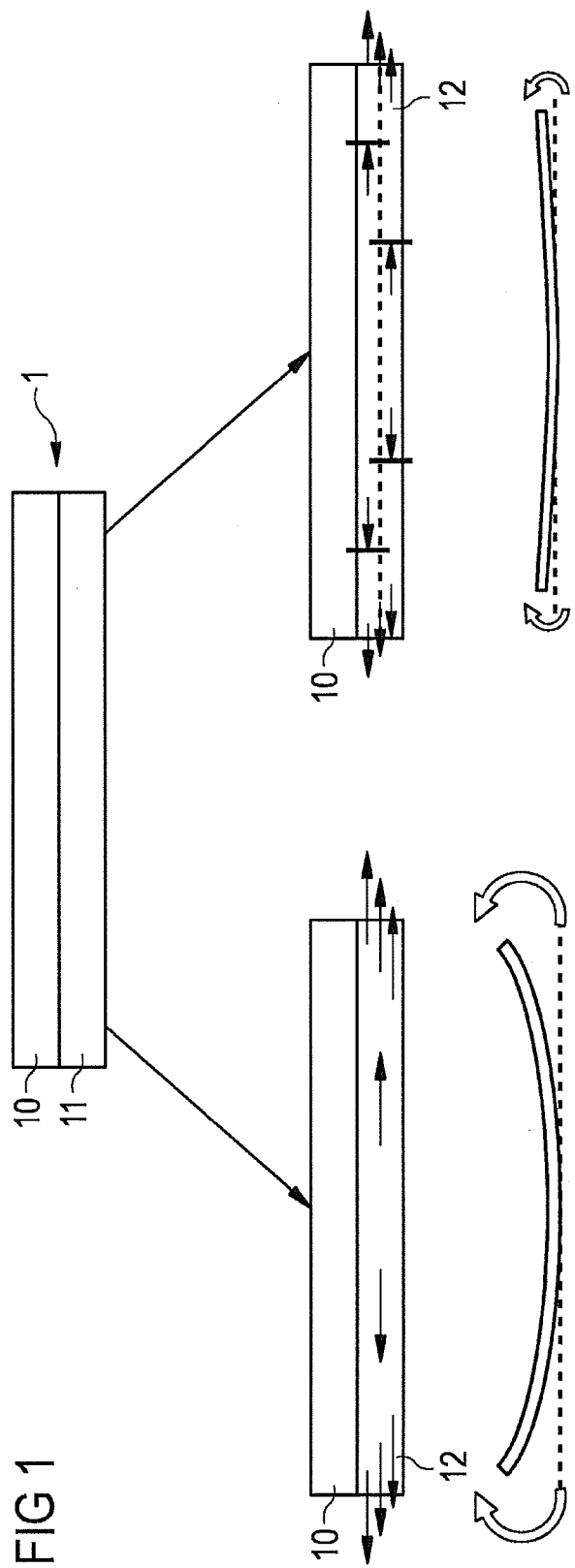
FIG. 1 is a schematic representation of a support with applied metal layer.

In my method of producing an optoelectronic component, I provide an epitaxially grown layer sequence on a growth substrate and deposit a metal layer thereon. A molding support is then applied to the metal layer, which support comprises a support material with a first coefficient of thermal expansion, together with a fiber mesh with a second coefficient of thermal expansion functionally bonded to the support material. The growth substrate is then detached. The support material used may be a polymeric material.

Combining a support material with a fiber mesh results in a combined coefficient of thermal expansion, which remains adapted to the coefficient of thermal expansion of the metal layer even at elevated temperatures.

The composite of fiber mesh and polymeric support material then makes it possible, in particular, to carry out processes at temperatures above the glass transition temperature of the polymeric support material. The fiber mesh introduced into the support material compensates the rise in the coefficient of thermal expansion of the support material (the "CTE jump") and thus reduces mechanical loading in the region of the interface between the metal layer and the support material.

Altogether, the fiber mesh of the molding support means that the coefficient of thermal expansion of the same remains adapted or approximately adapted to the coefficient of the metal layer, thereby minimizing mechanical loading due to thermal deformation in further method steps. As a result, the quality of the optoelectronic components is improved and the reject rate reduced.

A planar-extensive mesh of fibers of high tensile strength may be applied to the metal layer and then the support material deposited thereon. In this instance, the fiber mesh is arranged between the metal layer and the support material, the support material flowing at least partially through the fiber mesh and being, capable of bonding with the metal layer. The cohesive fiber mesh of differently oriented fibers ensures high tensile strength in both spatial directions.

A support material with the first coefficient of thermal expansion may be applied to the metal layer and then a planar-extensive mesh of fibers of high tensile strength and with a lower coefficient than the first coefficient of thermal expansion may be applied to the support material. The two are then hardened such that the support material and the fiber mesh become functionally intimately bonded together. The high tensile strength and low coefficient of thermal expansion of the fiber mesh then counteract elevated thermal expansion of the support material in the event of a jump in temperature, in particular extending beyond the glass transition temperature of the support material.

Alternatively, the planar-extensive mesh of high tensile strength fibers is embedded between a plurality of layers of support material. It is thus completely surrounded thereby and brings about thermal expansion of the support material due to its elevated tensile strength in the event of low inherent tensile strength.

It is possible to provide prefabricated molding supports of support material and fiber mesh and apply them in a single method step to the metal layer. It is alternatively also possible to deposit support material and fiber mesh on the metal layer in separate layers and allow them to harden.

The improvement in the coefficient of thermal expansion of the molding support due to the combination of the different coefficients of thermal expansion and the high tensile strength of the fiber mesh is achieved inter alia by forming covalent bonds between the fibers of the planar-extensive mesh and the support material. The covalent bonds above, all counteract shear forces which arise in the support material during thermal expansion. As a result, the initial coefficient of thermal expansion of the molding support at room temperature is also conserved at high temperatures and thus adapted to the coefficient of thermal expansion of the metal layer.

Depending on the materials used, an adhesive layer may be applied between the support material of the molding support or the fiber mesh of the molding support and the metal layer.

To improve stability during production, a layer thickness of the molding support may substantially correspond to 1.5 to 4 times the film thickness of the metal layer.

Plastics fibers of elevated tensile strength and with a relatively high glass transition temperature are suitable as materials for the fiber mesh. These include, for example, aramide fibers, Zylon® fibers, polyhexamethylene adipamide fibers, polycaprolactam fibers or indeed polyacrylonitrile. Glass fibers are also suitable. Various epoxy resins may be used as the support material, or indeed also silicone or plastics, which can be "molded". The support material may take the form of a soft paste, a liquid of relatively high viscosity, or indeed a small grained granular product.

The molding support may be removed after detachment of the growth substrate. This may in particular proceed prior to singulation into optoelectronic components, for instance semiconductor chips. In this instance, the molding support may be reused for further production methods. In this case, the metal layer preferably mechanically stabilizes the epitaxially grown layer sequence.

Alternatively, at least part of the molding support remains in the component. The molding support may, on singulation, in particular be severed into optoelectronic components, for instance semiconductor chips.

An optoelectronic layer may be produced on a growth substrate by epitaxial growth methods and then optoelectronic components are singulated.

These are applied to a carrier or "tape" for further processing such that spacing is provided between each pair of adjacent optoelectronic components. A flexible and mobile fiber mesh is then placed over the components such that parts of the fiber mesh are also located in the interspaces between the components. The interspaces are then filled with a support material such that the fiber mesh is embedded in the support material. The tape may then be removed and the ready-singulated components further processed as an overall unit. Here too, it is possible to use prefabricated molding supports of support material and fiber mesh.

Filling with the support material and embedding of the fiber mesh in the support material greatly reduces the combined coefficient of thermal expansion at high temperatures such that damage to the individual components by thermal deformation of the support material is reduced.

My methods and components are explained in detail below with reference to the drawings and with the aid of a number of examples. Elements which are the same in the individual figures are indicated with the same reference numerals. The relationships between the elements are not shown to scale, however, but rather individual elements may be shown exaggeratedly large to assist in understanding.

In the examples shown in the drawings, the optoelectronic component is produced using thin film technology. Such a thin-film light-emitting diode chip is distinguished by at least one of the following characteristic features:

a reflective layer is applied to or formed on a side across from the desired emitting sides of the radiation-generating, semiconductor layer sequence, this being in particular a radiation-generating epitaxial layer sequence, the reflective layer reflecting at least some of the electromagnetic radiation generated in the semiconductor layer sequence back into it;

the thin-film light-emitting diode chip comprises a support element which is not the growth substrate on which the semiconductor layer sequence was grown epitaxially but, rather, is a separate support element, which was attached subsequently to the semiconductor layer sequence;

the semiconductor layer sequence has a thickness of 20 µm or less, in particular of 10 µm or less;

the semiconductor layer sequence is free of a growth substrate. "Free of a growth substrate" her means that a growth substrate optionally used for growth has been removed from the semiconductor layer sequence or at least greatly thinned. In particular, it is thinned such that it is not self-supporting either alone or together with the epitaxial layer sequence. The remaining remnant of the greatly thinned growth substrate is unsuited in particular as such to the function of a growth substrate; and the semiconductor layer sequence contains at least one semiconductor layer with at least one face which comprises an intermixing structure, which ideally leads to an approximately ergodic distribution of the light in the semiconductor layer sequence, i.e. it exhibits scattering behavior which is as ergodically stochastic as possible.

The basic principle of a thin-film light-emitting diode chip is described, for example, in I. Schnitzer et al., Appl. Phys. Lett. 63 (16) 18 Oct. 1993, pages 2174-2176, the subject matter of which is incorporated herein by reference. Examples of thin-film light-emitting diode chips are described in EP 0905797 A2 and WO 02/13281 A1, the subject matter of which is incorporated herein by reference.

A thin-film light-emitting diode chip is a good approximation of a Lambertian surface emitter and is therefore, for example, well suited to use in a light of a floodlight type, for instance an automotive headlight.

In this case, the material system used is a III-V compound semiconductor material, namely gallium nitride, the first sublayer 12 being p-doped and the sublayers 11, 11a facing the transparent carrier substrate 40 being n-doped. Other material systems may also be used.

A III-V compound semiconductor material comprises at least one element from main group three such as, for example, B, Al, Ga, In, and one element from main group five such as, for example, N, P, As. In particular, the term "III-V compound semiconductor material" encompasses the group of binary, ternary or quaternary compounds which contain at least one element from main group three and at least one element from main group five, for example, nitride and phosphide compound semiconductors. Such a binary, ternary or quaternary compound may moreover comprise, for example, one or more dopants and additional constituents.

Accordingly, a II-VI compound semiconductor material comprises at least one element from main group two such as. For example, Be, Mg, Ca, Sr, and one element from main group six such as, for example, O, S, Se. In particular, a II-VI compound semiconductor material comprises a binary, ternary or quaternary compound which comprises at least one element from main group two and at least one element from main group six. Such a binary, ternary or quaternary compound may moreover comprise, for example, one or more dopants and additional constituents. The II-VI compound semiconductor materials, for example, include: ZnO, ZnMgO, CdS, ZnCdS, MgBeO.

FIG. 1 is a schematic representation of a wafer structure to assist in explaining issues we addressed.

In this representation, a metal layer 10 of nickel is applied, with a thickness of roughly 110 µm to a support 11 with a thickness of 200 to 400 µm. The coefficient of thermal expansion CTE of nickel amounts to around 13 ppm/K. An epitaxial layer sequence is deposited over the nickel using thin-film technology, this not being shown in FIG. 1 for the sake of simplification.

The support is known as a "mold" and serves to stabilize the thin metallized nickel layer. After application of the support 11, as a rule a growth substrate, likewise not shown, is detached so that the epitaxial layer sequence can be contacted and the structures necessary for light outcoupling applied. The metal layer 10 may on the one hand serve as a rear contact, while on the other hand it is also suitable for heat dissipation during subsequent operation of the component.

As indicated here, the metal layer 10 and the support layer 11 display different coefficients of thermal expansion CTE. Since the support layer substantially comprises a plastics material, for example, a thermoplastic or a thermoset, the coefficient of thermal expansion CTE thereof is very highly dependent on a glass transition temperature Tg of the material used. When, for example, an epoxy resin is used as support material, the coefficient of thermal expansion jumps by a factor of 4 in the glass transition temperature range, for example, at around 70° C., from CTE(1)≈10 ppm/K below the glass transition temperature to CTE(2)≈44 ppm/K above the glass transition temperature.

On subsequent processing in which the glass transition temperature is exceeded in individual process steps, this leads to the behavior illustrated in the left-hand portion of FIG. 1. As a result of the different coefficients of thermal expansion, the support material 12 lengthens significantly relative to the metal layer 10 such that the outer ends of the wafer bend upwards due to the mechanical stress caused thereby. In addition to the bending shown, the mechanical stress may also lead to cracks or fissures in the metal layer and/or the layer sequence such that the optoelectronic component reject rate is greatly increased.

We make the support material 11 not from just one single material, but rather additionally to provide a fiber mesh of high tensile strength and with a markedly lower coefficient of thermal expansion in the support material. The coefficient of thermal expansion may preferably even assume negative values around the glass transition temperature, i.e. the fiber mesh contracts if the temperature increases. If the temperature increases, the tensile strength and the lower coefficient of thermal expansion than the support material surrounding the mesh counteract thermal expansion of the support. In other words, as a result of the fiber mesh a combined coefficient of thermal expansion formed from the coefficient of the support material and that of the fiber mesh is adapted to the coefficient of thermal expansion of the metal layer 10 of the layers bonded thereto. The combined coefficient of thermal expansion may thus be reduced to a value distinctly below 44 ppm/K such that the severity of the curvature is reduced, as shown schematically in the right-hand portion of FIG. 1.

Figure 5:
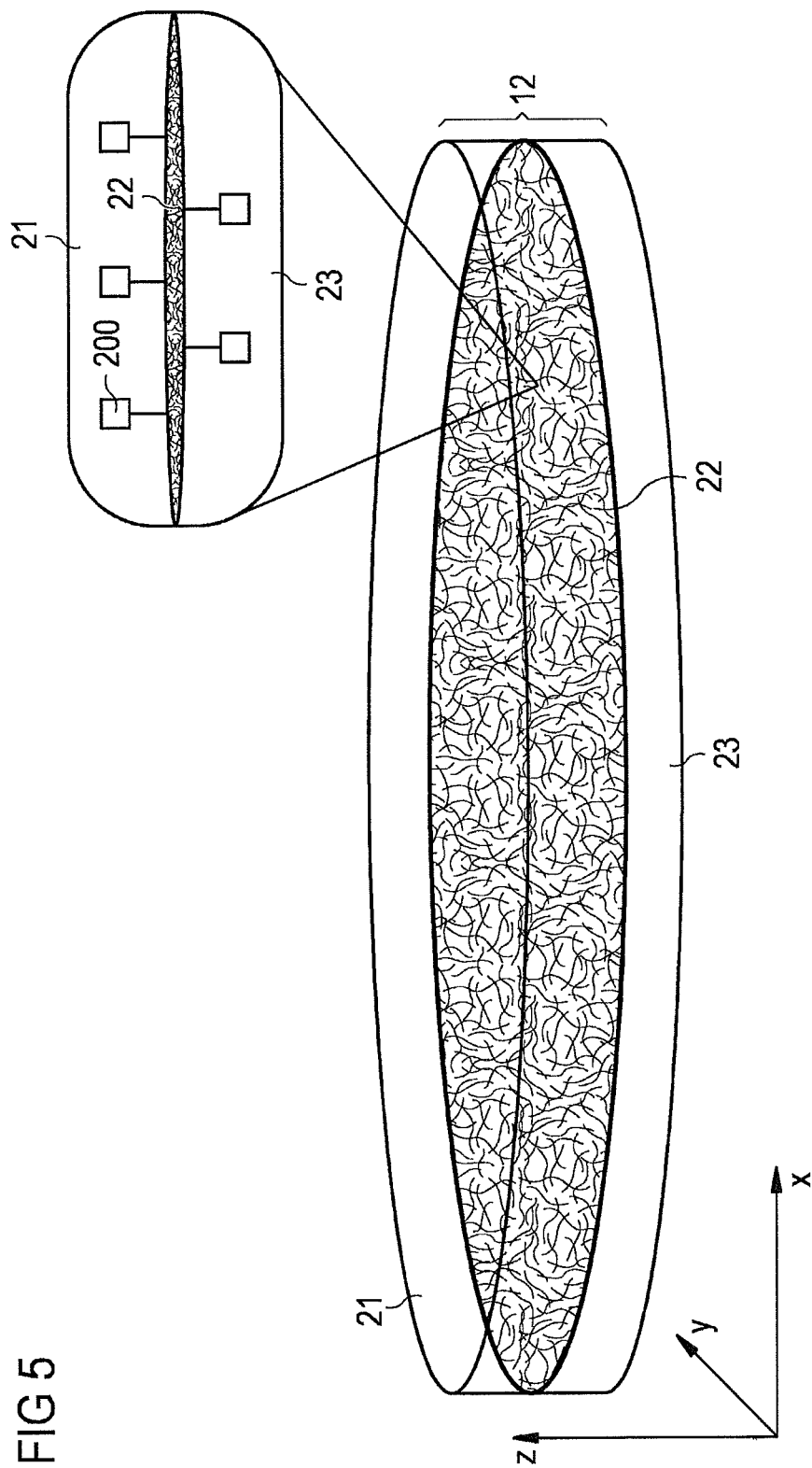
FIG. 5 shows an example of a molding support with an explanation of the elevated stability in the event of thermal deformation.

In this respect, FIG. 5 shows an example of a support in which the glass fiber mesh 22 is embedded between two support material layers 21 and 23. The glass fibers 22 comprises a plurality of intermeshed fibers extending in the x- and y-directions, which exhibit a very high tensile strength simultaneously combined with a very low coefficient of thermal expansion. This coefficient of thermal expansion is markedly lower than the coefficient of thermal expansion of the support material 21 or 23 surrounding the fiber mesh 22 relative to a temperature range around the glass transition temperature, and possibly even negative.

The fiber mesh may be constructed, for example, from glass fibres. Plastics fibres such as aramide, Zylon®, polyhexamethylene adipamide, polycaprolactam or indeed polyacrylonitrile are likewise suitable. In principle, any fiber is suitable which displays an elevated tensile strength simultaneously combined with a low coefficient of thermal expansion and, moreover, is resistant to the temperatures arising during further processing of the component. Epoxy resins or indeed plastics thermoplastics or thermosets are used as the support material.

When the fiber mesh 22 is embedded into the two support layers and subsequently cured, covalent bonds 200 form between individual fibers of the mesh 22 and the support material 21 or 23 surrounding them. The covalent bonds are so strong that they bring about good anchoring of the fiber mesh in the support matrix. This results in only slight thermal expansion of the support even at temperatures above the glass transition temperature of the material 21 or 23.

Figure 2:
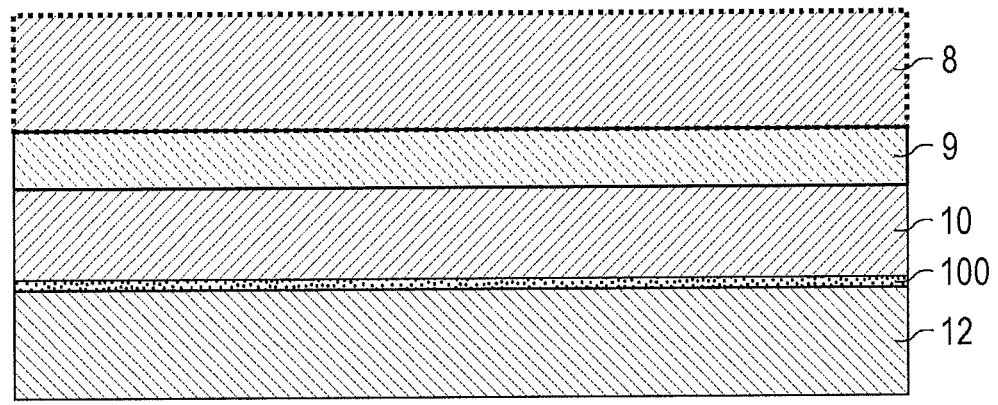
FIG. 2 shows a schematic example of an optoelectronic component during the production method.

FIG. 2 shows a structure obtained during my production method.

Semiconductor layers are applied as an epitaxial layer sequence 9 in a plurality of steps to a growth substrate 8, for example, of sapphire, silicon or other substrates suitable for epitaxial deposition. Some of these layers of the layer sequence 9 allow charge carrier recombination and form the light-emitting layer.

A metal layer 10, for example, of nickel, copper or indeed a semiconductor material such as silicon, is then deposited on the epitaxially grown layer sequence 9. The metal layer 10 on the one hand serves as a heat sink during operation of the optical component, but it may at the same time also contact the epitaxially grown layer sequence 9 electrically. For further processing, the growth substrate 8 may be removed in further steps so that the epitaxial layer sequence 9 may undergo further treatment from this side.

To this end, an adhesive layer 100 is deposited on the metal layer 10, to bond the latter to a molding support 12. In this example, the molding support 12 comprises a support material of epoxy resin in which a fiber mesh has been embedded.

The growth substrate 8 is then removed, for example, by laser lift-off. During laser lift-off and further process steps, the temperature of the molding support and the metal layer is increased to above the glass transition temperature of the support material of the molding support. As a result of the coefficient of thermal expansion now being controlled by the additionally introduced fiber mesh, mechanical loading on the metal layer 10 due to the now reduced thermal expansion remains low.

After detachment of the growth substrate, the molding support 12 may be removed again, in particular prior to singulation into semiconductor chips. The metal layer 10 may in this case serve in mechanical stabilization of the epitaxial layer sequence.

Alternatively, the molding support may, on singulation, be severed into semiconductor chips such that part of the molding support remains in the singulated semiconductor chips. In this case, part of the molding support thus forms part of the singulated semiconductor chip.

Figure 3:
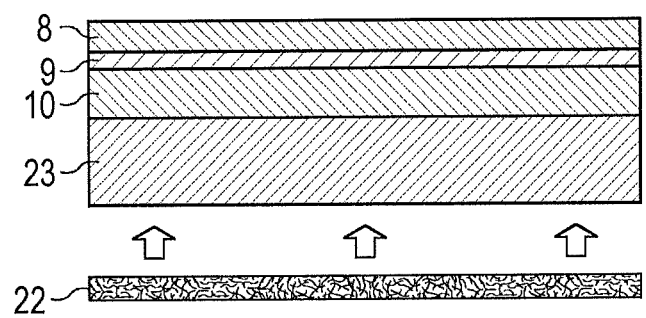
FIG. 3 is a schematic representation of an optoelectronic component during, the production method.

FIG. 3 shows a further example, in which the proposed molding support is produced in individual process steps during the production method. In this example too, a 5 µm thick gallium nitride layer was grown epitaxially for light emission on a substrate 8, preferably of sapphire, a 120 µm thick metal layer 10, in this example a nickel layer, then being applied. This metal layer is then covered with an approximately 200 µm thick liquid epoxy resin layer in which a glass fiber mesh 22 is embedded in a further process step. The epoxy resin layer with the embedded glass fibers is then cured such that covalent bonds form between epoxy material and glass fibre layer. The resultant molding support then displays only a low coefficient of thermal expansion, both at room temperature and at high temperatures, which coefficient remains within the range of the coefficient of thermal expansion of the nickel layer.

To produce and manufacture such a molding support it is possible to produce it separately from the production processes and then to bond it to the metal layer during the production method of the optoelectronic component as a whole.

It is alternatively likewise possible, as shown in FIG. 3, to form it jointly with the optoelectronic component during the production process.

Figure 4:
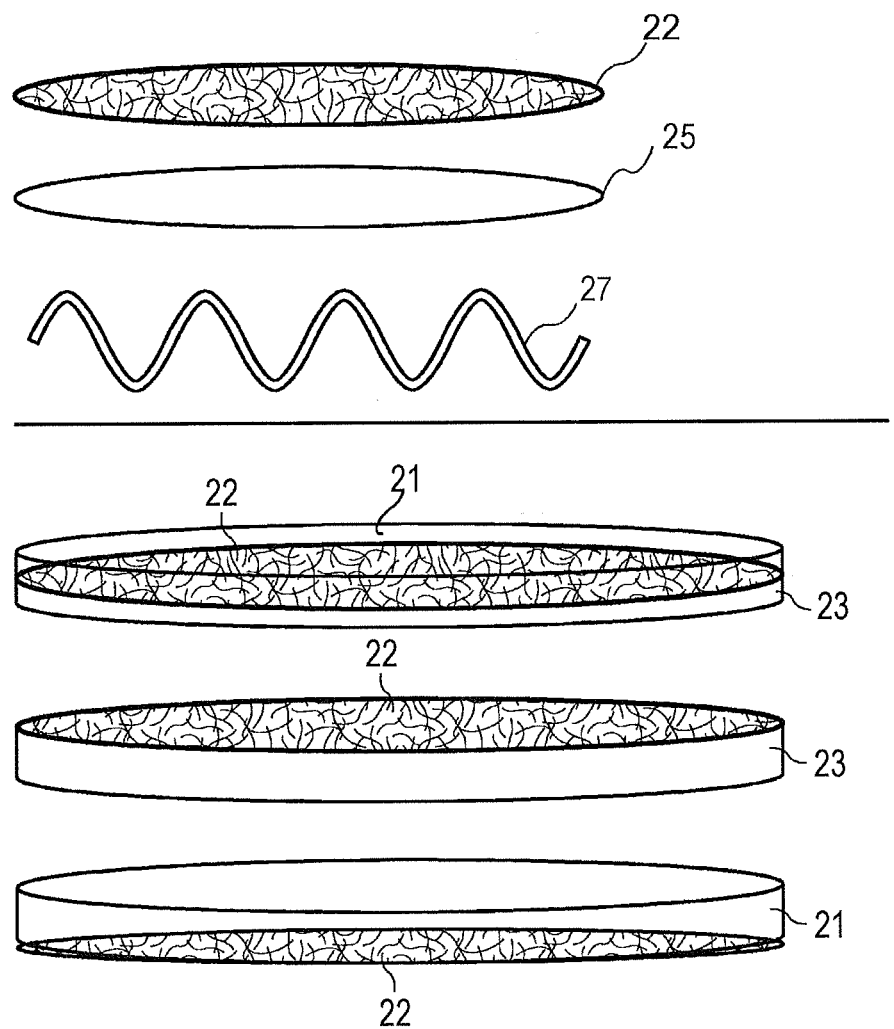
FIG. 4 shows various examples of producing a molding support.

FIG. 4 shows further examples of the molding support, showing schematically a fiber mesh 22, a sheet 25 and a random distribution 27. The molding support may, for example, take the form of a sandwich structure consisting of at least two support material layers and a glass fiber layer embedded therebetween. In addition to this sandwich structure with an individual glass fiber layer, a plurality of glass fiber layers may also conceivably be embedded in the support material. Alternatively, the fiber mesh 22 may also be applied to the top of the molding support. For example, the fiber mesh may be arranged between the metal layer and the support material 23, suitable adhesive materials ensuring that the fiber mesh 22 of the molding support is also bonded to the metal layer. In one example, support material may flow through holes in the fiber mesh 22 and in this way bond intimately with the metal layer.

In another example, the fiber mesh according to FIG. 4 is applied to the reverse (bottom) of the molding support. In other words, the support material 21 of the molding support is arranged between the fiber mesh 22 and a metal layer of an optoelectronic component.

Figure 6:
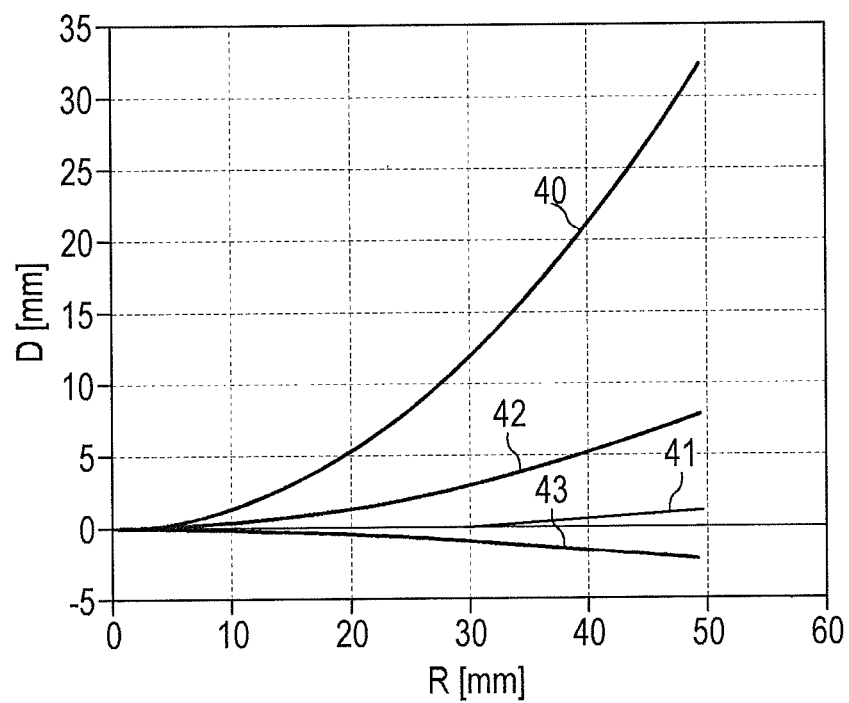
FIG. 6 shows a diagram plotting deformation for various glass fiber concentrations.

The different coefficient of thermal expansion between a metal layer of an optoelectronic component and the molding, support leads to bending or deformation, or indeed to complete failure of the bond and thus to detachment of the molding support, if the processing temperature is above the glass transition temperature of the support material. Depending on the additionally introduced fiber mesh which is embedded in the support material, the difference in the coefficients of thermal expansion between the metal layer and the combined coefficient of thermal expansion of the molding support is reduced and deformation is likewise reduced, FIG. 6 shows a diagram which illustrates the deformation D in mm at a temperature above the glass transition temperature of the epoxy resin of approx. 170° C. as a function of wafer radius R with various glass fiber concentrations.

The greatest deformation arises in the case of a molding support which consists solely of an epoxy resin as "molding material", illustrated by a curve 40.

By adding a glass fiber in different quantities by weight, deformation may be reduced. As a curve 41 shows, a glass fiber concentration of just 50 g/mm$^2$ brings about reduced deformation. In this example, a glass fiber concentration of 100 g/mm$^2$, illustrated by a curve 42, results in barely detectable deformation. At this glass fiber concentration, the combined coefficient of thermal expansion of the molding support is thus identical to the coefficient of thermal expansion of the metal layer used in the example. A still higher glass fiber concentration gives rise to even slightly negative deformation, as shown by curve 43. This is consequence of the fact that the glass fiber content with its negative coefficient of thermal expansion predominates. With the quantity of glass fiber introduced, the decrease at high temperatures is greater than any possible increase by the support material and is then below the value of the metal layer bonded thereto.

As a result, depending on the metal layer used, a combination of support material and fiber mesh may be found in which the difference in the coefficients of thermal expansion is minimised such that deformation is very largely prevented.

A further example is shown in FIG. 7. In this example, the optoelectronic components 31 produced in wafer form are singulated and adhesively bonded to a tape 30. The distance between two components amounts to d. In a next step, a flexible fiber mesh is then placed on the singulated components 31. The fiber mesh is in this case so flexible that parts of the mesh 32 may also enter the spaces between two singulated components 31. The fiber mesh thus lies on the one hand in the interspaces, on the other hand on the singulated components. In a subsequent step, a support material 33 is then applied to the fiber mesh 32. The support material 33 may in this case be present in liquid form, granular form, or indeed in film form. The support material completely fills the interspaces between the singulated components 31 and additionally uniformly embeds the fiber mesh 32.

In a further step, the tape 30 is then removed from the singulated components such that the latter may then undergo further treatment. The fiber mesh, embedded in the support material, then counteracts thermal expansion of the support material in the event of a temperature change and prevents mechanical damage to the individual components 31.

The description made with reference to examples does not restrict my methods and components to these examples. Rather, this disclosure encompasses any novel feature and any combination of features, including in particular any combination of features in the appended claims, even if the feature or combination is not itself explicitly indicated in the claims or examples.

The invention claimed is:

1. An arrangement of a plurality of optoelectronic components spaced apart from one another on a tape, the optoelectronic components comprising:
    an epitaxially grown layer sequence suitable for light emission in a main direction;
    a metal layer on a side of the epitaxially grown layer sequence remote from the main direction; and
    a molding support with a support material with a first coefficient of thermal expansion and with a fiber mesh with a second coefficient of thermal expansion functionally bonded to the support material;

wherein part of the fiber mesh and of the support material is arranged in interspaces between two adjacent components.

2. The arrangement according to claim 1, wherein the second coefficient of thermal expansion in the glass transition temperature range of the support material and above is lower than the first coefficient of thermal expansion.

3. The arrangement according to claim 1, wherein the fiber mesh is embedded in the support material.

4. The arrangement according to claim 1, wherein the support material is bonded to the fibers of the planar-extensive mesh by formation of covalent bonds.

5. The arrangement according to claim 1, wherein a film thickness of the molding support is substantially to 1.5 to 4 times a film thickness of the metal layer.

6. The arrangement according to claim 1, wherein the support material comprises at least one of epoxy resin and plastics.

7. The arrangement according to claim 1, wherein the fiber mesh comprises at least one of aramide fibers, glass fibers, Zylon fibers, poly(p-phenylene-2,6-benzobisoxazole), polyhexamethylene adipamide fibers, polycaprolactam fibers, and polyacrylonitrile.

* * * * *